(12) United States Patent
Sensfuss et al.

(10) Patent No.: US 8,217,136 B2
(45) Date of Patent: Jul. 10, 2012

(54) PROCESS FOR PREPARING THIENO[3,4-B] PYRAZINE COPOLYMERS, THIENO[3,4-B]—PYRAZINE COPOLYMERS PREPARED BY THIS PROCESS, AND THEIR USE

(75) Inventors: Steffi Sensfuss, Jena (DE); Maher Al Ibrahim, Ilmenau (DE); Lars Blankenburg, Kahla (DE); Elisabeth Klemm, Weimar (DE); Raja Shahid Ashraf, Eindhoven (NL); Munazza Shahid, Eindhoven (NL)

(73) Assignees: Thüringisches Institut für Textil-und Kunststoff-Forschung E.V., Rudolstadt (DE); Friedrich Schiller Universität Jena, Jena (DE)

( * ) Notice: Subject to any disclaimer, the term of this patent is extended or adjusted under 35 U.S.C. 154(b) by 346 days.

(21) Appl. No.: 12/225,606

(22) PCT Filed: Mar. 22, 2007

(86) PCT No.: PCT/DE2007/000544
§ 371 (c)(1),
(2), (4) Date: Jul. 13, 2009

(87) PCT Pub. No.: WO2007/110062
PCT Pub. Date: Oct. 4, 2007

(65) Prior Publication Data
US 2009/0227763 A1    Sep. 10, 2009

(30) Foreign Application Priority Data
Mar. 24, 2006 (DE) .......................... 10 2006 014 172

(51) Int. Cl.
*C08G 75/00* (2006.01)
(52) U.S. Cl. ......... 528/377; 528/380; 528/373; 528/378
(58) Field of Classification Search .................. 528/377, 528/380, 373, 378
See application file for complete search history.

(56) References Cited

U.S. PATENT DOCUMENTS
6,413,658 B1    7/2002    Araki

FOREIGN PATENT DOCUMENTS
WO    WO9732914    9/1997

OTHER PUBLICATIONS

XP-002444935—"Thienopyrazine-Based Low-Bandgap Poly(Heteroaryleneethynylene)s for Photovoltaic Devices" Macromolecular Rapid Communications, vol. 27, pp. 1454-1459, 2006.
XP-002444936—"Synthesis and Properties of Novel Low-Band-Gap Thienopyrazine-Based Poly(Heteroarylenevinylene)s"—Macromolecules vol. 39, pp. 7844-7853, 2006.
XP-002444937—2006.
Synthesis and Characterization of New Fluorene-Acceptor Alternating and Random Copolymers for Light-Emitting Applications by Wen Chung Wu, Cheng-Liang, Liu, and Wen-Gang Chen—Polymer 47, pp. 527-538 (2006).
A Second Look At Polythieno [3,4-*b*] Pyrazines: Chemical vs Electrochemical Polymerization and its Effect on Band Gap by Don D. Kenning, Seth C. Rasmussen—Macromolecules 2003, pp. 6298-6299.
A Red, Green and Blue (RGB) Polymeric Electrochromic Device (PECD): The Drawing of the PECD Era by Gursel Sonmez, Clifton K. F. Shen, Yves Rubin, and Fred Wudl, 2004 Chem. 116(12) pp. 1524-1528.

*Primary Examiner* — Randy Gulakowski
*Assistant Examiner* — Shane Fang
(74) *Attorney, Agent, or Firm* — Horst M. Kasper

(57) ABSTRACT

New thieno[3,4-b]pyrazine copolymers are prepared by reacting 5,7-functionalized thieno[3,4-b]pyrazines with substituted aromatics in the presence of solvents, bases and polymerization catalysts, the copolymers thus prepared being employed preferably in the production of photovoltaic cells.

12 Claims, No Drawings

PROCESS FOR PREPARING THIENO[3,4-B] PYRAZINE COPOLYMERS, THIENO[3,4-B]—PYRAZINE COPOLYMERS PREPARED BY THIS PROCESS, AND THEIR USE

The invention relates to a method for preparing thieno[3,4-b]pyrazine copolymers, the thieno[3,4-b]pyrazine copolymers produced by said method and the use of the inventional copolymers in photovoltaic materials such as solar cells, photodiodes and photo detectors as well as in organic light-emitting diodes and transistors. The production of such copolymers is carried out by reacting of 5,7-functionalized thieno[3,4-b]pyrazines with substituted aromatics.

PRIOR ART

Polymeric thieno[3,4-b]pyrazines of the formula IV are known (Don D. Kenning, Seth C. Rasmussen Macromolecules 2003, 36, 6298: Gursel Sonmez, Clifton K. F. Shen, Yves Rubin, Fred Wudl: Angew. Chem. 2004, 116(12), 1524-1528):

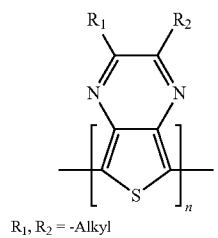

Formula IV $R_1, R_2$ = -Alkyl

They are produced by electro-polymerization or under use of $FeCl_3$ as a chemical oxidant. The polymers are insoluble and therefore cannot be processed from the solution. Neither yield alkyl side groups of sufficient solubility. Furthermore, the latter mentioned method is characterized in that either $Fe^{3+}$ remains complexly bonded in the polymer which renders the application of a dedoping technique such as required for photovoltaic usage impossible or the cation radicals formed in the course of electro-polymerization will be slightly over oxidized and fail for polymerization. A further problem is the high sensitivity of the polymers towards oxygen rendering an application more difficult. It is further known that the presence of ethynyl bonds raises, due to the high oxidizing potential of the latter, the stability of a polymer bondage towards oxygen.

Furthermore, it is known to use polymeric thieno pyrazine as luminescent layers in light emitting diodes (U.S. Pat. No. 6,413,658 B1, Jul. 2, 2002, inventor.: Kattsumi Araki).

OBJECT OF THE INVENTION

It is an object of the invention to develop copolymers which do not exhibit the properties opposing a technical application of the poly(thieno[3,4-b]pyrazine)s such as oxidation sensitivity and the heavy solubility, whereby the positive characteristics of the long wave light absorption has to be maintained and in which a wide variety of physical characteristics are attainable by varying the comonomers. It is a further object of the invention to provide a method for developing thieno[3,4-b]pyrazine copolymers which do not exhibit the negative properties of the oxidation polymerization. It is a further object of the invention to use the inventional copolymers in photovoltaic materials, organic light emitting diodes and in transistors. Copolymers according to the inventional structure and their use in photovoltaic materials, such as in solar cells, in photodiodes and photo detectors as well as in organic light emitting diodes and in transistors are heretofore unknown in literature.

According to the invention the method for preparing thieno [3,4-b]pyrazine copolymers, as well as the application of the new thieno[3,4-b]pyrazine copolymers produced by said method is realized by reacting 5,7-disubstituted thieno[3,4-b]pyrazines of the formula I with substituted aromatics of the formula II and/or the formula III, whereby the structural elements I and II, I and III as well as I and (II+II) are alternatingly added into the polymer (mol ratio 1:1) in the course of the polycondensation and wherein represent

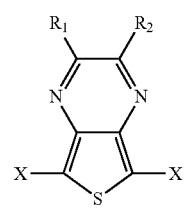

Formula I $R_1/R_2$=phenyl; pyridine-2yl; pyridine-4-yl; thiophene-2-yl; thiophene-3-yl; 2,2-bipyridine-3,3-diyl; biphenyl-2,2-diyl; —O-alkyl; -phenylene-O-alkyl; or —H X=-halogen; —Ar—CHO; or —Ar-halogen Ar=thieno[3,4-b]pyrazine-5,7-diyl; benzothiadiazol-4,7-diyl; 1,4-phenylene; 1,3-phenylene; 9,10-anthrylene; 2,6-anthrylene; or 2,7-fluorenylene

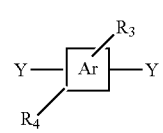

Formula II $R_3/R_4$=linearly or branched -alkyl; —O-alkyl; -phenylene-O-alkyl; -styryl; or —H Y=—C≡CH; —$CR_5$=$CHR_6$; —$B(OH)_2$; —$B(Oalkyl)_2$; or —$CH_2Z$ with $R_6$=—H; or —Ar-halogen with $R_5$=—H; —CN, or —Ar with Z=—$P(O)(OAlkyl)_2$; —$P(phenylene)_3$halogen; —$P(alkyl)_3$halogen; or —CN Ar=thieno[3,4-b]pyrazine-5,7-diyl; benzothiadiazol-4,7-diyl; 1,4-phenylene; 1,3-phenylene; 9,10-anthrylene; 2,6-anthrylene; or 2,7-fluorenylene

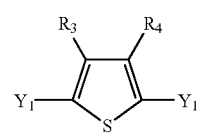

Formula III $R_3/R_4$=linearly or branched: -alkyl; —O-alkyl; -phenylene-O-alkyl; -styryl; or —H $Y_1$, —C≡CH; —$CR_5$=$CHR_6$; or —$CH_2Z$ with $R_6$=—H; or —Ar-halogen with $R_5$=—H; —CN; or —Ar with Z=—P(O)(Oalkyl)$_2$; —P(phenylene)$_3$halogen; —P(alkyl)$_3$halogen; or —CN;

Ar=Thieno[3,4-b]pyrazine-5,7-diyl; benzothiadiazol-4,7-diyl; 1,4-phenylene; 1,3-phenylene; 9,10-anthrylene; 2,6-anthrylene; or 2,7-fluorenylene with the exception of the reaction of Formula I provided that X=halogen means—with Formula II—when B(OH)$_2$ or B(Oalkyl)$_2$ stands for Y and 2,7-fluorenylen for Ar—as well as Formula I—when Ar-halogen stands for X—with Formula II—when B(OH)$_2$ or B(Oalkyl)$_2$ stands for Y.

The inventional method can also be carried out inversely. This means that the thieno[3,4-b]pyrazine can substitute X for the substituents Y or $Y_1$ and vice versa. The copolymers can be generated by each suited C—C-coupling method, for example, the synthesis will succeed by employing the Sonogashira reaction, the Heck reaction, Suzuki cross coupling or by Wittig, Horner-Wadsworth-Emmons as well as via the Knoevenagel-condensation. The method can be carried out in such a manner that the copolymerization is performed in presence of solvents such as, for example, toluene, benzene, dimethylformamide, dimethylacetamide, tetrahydrofuran or dioxane at ambience, or at higher temperatures, preferably at 60° C. up to 80° C., with the Heck reaction even up to 140° C., at a reaction time of 4 to 20 hours. The method can be advantageously performed in such a manner that, apart from suited bases (for example, amine, potassium tert.-butylate, potassium carbonate), polymerization catalysts, preferably palladium(0)- or Pd(II)-compounds in the presence of Cu(I)-compounds are employed. However, the inventional method will also succeed without the presence of copper compounds.

The following examples are mentioned for 5,7-disubstituted thieno[3,4-b]pyrazine (comonomers) according to formula I as being suited for copolymerization:

5,7-dibromo-thieno[3,4-b]pyrazine (X=Br, $R_1$, $R_2$=H)

5,7-dibromo-thieno-2,3-diphenylthieno[3,4-b]pyrazine (X=Br, $R_1$,$R_2$=$C_6H_5$)

5,7-(bis-4-formyl-phenyl)-thieno[3,4-b]pyrazine (X=phenylene-CHO, $R_1$, $R_2$=H)

5,7-(bis-4-formyl-2,5-dihexyloxyphenyl)-thieno[3,4-b]pyrazine (X=phenylene-CHO(O$C_6H_{13}$)$_2$; $R_1$, $R_2$=H)

5,7-divinyl-thieno[3,4-b]pyrazine (X=CH=$CH_2$)

5,7-diethynyl-thieno[3,4-b]pyrazine (X=C≡CH)

5,7-dibromo-2,3-di(2-pyridyl)thieno[3,4-b]pyrazine.

As suitable aromatics (comonomers) of the formula II the following examples will be mentioned:

1,4-bis[4,4,5,5-tetramethyl-(1,3,2)-dioxaborolane-2-yl]-2,5-didodecyloxyphenylene 2,7-dioxaborolane-9,9-didecylfluorene 3-(4-bromo-2,5-dioctyloxyphenyl)-2-(4-bromophenyl)-acrylnitril 2,7-dibromo-9,9-didecylfluorene 1,4-diethynyl-2,5-didodecyloxybenzene 4,7-dibromo-2,1,3-benzothiadiazol 1,4-bis(4'-bromostyryl)-2,5-didodecyloxybenzene 1-(4-ethynyl-2,5-dioctyloxyphenyl)-2-(4-ethynyl-2,5-dioctadecyloxyphenyl)ethylene Trans,trans-2,5-distyryl-1,4-dibromobenzene 2,5-dioctyl-p-xylylene-bis(diethylphosphonate)

As suited aromatics (comonomers) of the formula III the following examples will be mentioned:

2,5-diethynyl-3-dodecylthiophene 2,5-diethynyl-3,4-didocecylthiophene

The inventional new thieno[3,4-b]pyrazine copolymers are partially characterized by a reduced sensitivity towards oxygen and an increased stability towards oxygen, respectively, due to the presence of ethynyl—and/or vinylene compounds within the copolymers and their inherent high oxidation potential, having, in turn, a positive effect on the applicability of the respective copolymers in the respective cases. All inventional copolymers have a small band gap and, hence, a longwave light absorption at a simultaneously good solubility and film formation, so that they are best suited for use in photovoltaic cells, such as solar cells. Owing to the unfavorable structure of expenditure for inorganic solar modules, photovoltaic concepts are highly attractive which concepts compared to the former require low investments costs and production costs. In the case of the synthetic material solar cells on the basis of the inventional new thieno[3,4-b]pyrazine copolymers, the polymer processing from solutions of low energy costs opens a potential towards a low-cost thin film technology. The use of the inventional copolymers in photodiodes, photo detectors and organic light emitting diodes is also possible. Furthermore, due to the simultaneous presence of both, donor elements and acceptor elements in the copolymers, an application in ambi-polar transistors is thinkable which permit to setup circuits in analogy to the CMOS-technique, the essential advantage of which is the lower energy consumption compared to the p-technique or the n-MOS technique.

EXAMPLES

Examples of Embodiments 1-3 for Synthesis of the Inventional Copolymers

Embodiment 1 (Example 1)

Sonogashira; I+HI

Into a suitable reaction vessel 476 mg (1.066 mmol) 5,7-dibrom-2,3-diphenyl-thieno[3,4-b]pyrazine, 500 mg (1.066 mmol) 2,5-diethynyl-3,4-didodecylthiophene, 0.04 mmol Pd(P (phenylene)$_3$)$_4$ and 0.04 mmol CuI are given to a degassed solution of 40 ml diisopropylamine and 600 ml toluene under the exclusion of air. The mixture is stirred at ambience for 1 hour and subsequently heated at 65° C. for 40-50 hours. Then the mixture is given into methanol. The precipitating copolymer is filtered off, washed with methanol and is extracted with methanol for 24 hours. For cleaning, again a precipitation from methanol is carried out and an extraction with hexane. The subsequent drying in vacuum will yield:

0.7 g (87%) of the blue poly[3,4-d]dodecylthiophene-2,5-diylethynylene-(2,3-diphenyl-thieno[3,4-b]pyrazine-5,7-diyl)ethynylene]. $^1$H-NMR (250 MHz, CDCl$_3$): δ=7.37-7.06 (m, 10H), 2.63 (m, 4H), 1.48-0.64 (m, 4611) ppm. $^{13}$C-NMR (62 MHz, CDCl$_3$): δ 154.1, 148.3, 142.9, 138.7, 130.1, 129.2, 128.0, 120.1, 115.5, 95.2, 89.2, (—C≡C—), 31.9, 30.2, 29.7, 29.7, 28.8, 22.7, 14.1 ppm. GPC (Polystyrene standards): $M_w$=22700 μmol, $M_n$=14000; PDI=1.6; $P_n$=19. UV-Vis (chloroform): $\lambda_{max}$/nm (ε/1·mol$^{-1}$·cm$^{-1}$)) 265 (43800), 388 (44600), 628 (44000). ($C_{50}H_{60}N_2S_2$)$_n$ (753.17)$_n$ calculated: C, 79.74; H, 8.03: N, 3.72; S, 8.51. found: C, 79.32; H, 8.21; N, 3.58; S, 8.20; Br, 1.78.

Embodiment 2 (Example 2)

Suzuki, I+II

In a suitable reaction vessel 446 mg (1 mmol) 5,7-dibromo-2,3-diphenyl-thieno[3,4-b]pyrazine and 699 mg (1 mmol)

1,4-bis[4,4,5,5-tetramethyl-(1,3,2)-dioxaborolane-2-yl]-2,5-didodecyloxyphenylene will be mixed under exclusion of air (argon) with 1.5 mol % Pd(P(phenylene)$_3$)$_4$ and to which an aqueous potassium carbon solution 12 ml (2.0 molar) and 36 ml toluene are added. The mixture is heated for 72 hours under stirring to 80-90° C. Thereafter it is gradually added to methanol in order to precipitate the copolymer. Then it will be separated, washed with methanol and further cleaned by a multiple re-precipitation. After drying in vacuum, there will be obtained 0.6 g (80%) of the blue poly(2,3-diphenylthieno[3,4-b]pyrazine-alt-2,5-didodecyloxyphenylene)s. $^1$H-NMR (250 MHz, CDCl$_3$): δ=7.51-7.32 (m, 10H), 6.77 (s, 2H) 4.03 (t; 4H), 1.83-0.74 (m, 46H) ppm. $^{13}$C-NMR (62 MHz, CDCl$_3$): δ=153.2, 151.1, 149.7, 149.1, 139.8, 138.3, 132.0, 131.6, 129.9, 128.4, 127.8, 127.4, 123.0, 121.0, 117.6, 115.8, 114.0, 69.9, 68.5, 32.3, 31.9, 30.3, 29.6, 29.4, 26.2, 22.7, 14.1 ppm. GPC (polystyrene standards): M$_w$=1850 g/mol, M$_n$=1740; PDI=1.06; P$_n$=2.5. UV-Vis (chloroform): λ$_{max}$/nm (ϵ/(1·mol$^{-1}$·cm$_{-1}$)  344  (41400),  534  (35000. (C$_{48}$H$_{62}$N$_2$O$_2$S)$_n$ (731.10)n calculated: C, 78.86; H, 8.55: N, 3.83; S, 4.39. found: c, 76.42; H, 9.52; N, 2.19; S, 2.42; Br, 4.21.

Embodiment 3 (Example 3)

Horner, I+II

In a suitable reaction vessel 0.67 mmol (0.5 g) of 5,7-(Bis-4-formyl-3,6-dihexyloxyphenyl) thieno[3,4-b]pyrazine (formula I, X=pheyleneCHO, R$_1$, R$_2$=H) and 0.67 mmol (0.426 g) 2,5-dioctyloxy-p-xylene-bis(diethylphosphonate) will be dissolved anhydrously in 10 ml toluene and will be heated under stirring and under exclusion of air (argon) at the reflux. 2.67 mmol (0.300 g) potassium tert.-butanolate are added and heated for three hours at the reflux. After cooling to ambience it will be acidified with diluted HCl, the organic layer will be separated, washed neutral with water and dried. The toluene solution will be reduced, the polymer precipitated with methanol, then separated and thereafter with methanol, acetone extracted and dried in vacuum until weight constancy is obtained. The deep colored dark green polymer will be obtained by a 65% yield. $^1$H-NMR (400 MHz, CDCl$_3$): δ=8.57 (bs, 2H), 8.42 (bs, 2H), 7.59 (bs, 2H), 7.34-6.87 (m, 6H), 4.2-4.12 (m, 12H), 1.93-0.88 (m, 74H) ppm. $^{13}$C-NMR (400 MHz, CDCl$_3$): δ=151.3, 150.9, 149.8, 142.6, 140.5, 128.4, 127.6, 127.4, 123.8, 123.4, 122.5, 115.7, 114.3, 110.7, 110.38, 69.97, 69.6, 69.5, 31.9, 31.7, 31.6, 29.6, 29.5, 29.4, 26.3, 26.0, 25.9, 22.7, 22.6, 14.1, 14.0 ppm. GPC (THF, polystyrene standards): M$_W$=64600 g/mol, M$_n$=29200; PDI=2.2; P$_n$=27. UV-Vis (CHCl$_3$): λ$_{max}$/nm (ϵ/(1·mol$^{-1}$·cm$^{-1}$))  326  (18200),  437  (33300),  552  (23400). (C$_{68}$H$_{98}$N$_2$O$_6$S)n (1071.58)n calculated: C, 76.22; H, 9.22: N, 2.61; S, 2.99. found: C, 75.40; H, 9.36; N, 2.43; S, 2.54.

The Embodiments 4-7 (Examples 4-7) for the Application of these Copolymers in Photovoltaic Cells Embodiment 4 (Example 4)

For photovoltaic cells a thieno[3,4-b]pyrazine copolymer will be used according to embodiment 1 with R$_1$=R$_2$=phenyl, Ar=3,4-dialkylthiophen with R$_3$=R$_4$=C$_{12}$H$_{25}$ as electron donator and a methanofullerene, namely [6,6]-phenyl-C61-butyric acid methyl ester (PCBM) as electron acceptor. A layer of polyethylenedioxythiophene-polystyrenesulfonate (PEDOT-PSS, Baytron P., H. C. Starck, aqueous suspension) will be applied onto a substrate (polyester) coated with an indium tin oxide (ITO, 100 nm), operating as a transparent front electrode, in a thickness of about 100 nm by spin coating. Subsequently, and as a photo active layer, a composite of thieno[3,4-b]pyrazine copolymers and PCBM (1:1 mass ratio), referred to in the example, will be applied in a solution also by spin coating (layer thickness of about 100 nm). Chlorobenzene is employed as a solvent. The photovoltaic cell will be completed by a thermally vapor deposited aluminum electrode and subsequently characterized by recording current-voltage characteristics by means of an AM1.5 solar simulator (100 mW/cm$^2$). The solar cell obtained in such a manner exhibits a short-circuit current of 10.72 mA/cm$^2$, an open-circuit voltage of 670 mV, a space factor of 0.33 as well as an efficiency of 2.37%.

Embodiment 5 (Example 5)

For photovoltaic cells a thieno[3,4-b]pyrazine copolymer will be used according to embodiment 1 with R$_1$=R$_2$=phenyl, Ar=3,4-dialkylthiophene with R$_3$=R$_4$=C$_{12}$H$_{25}$ as electron donator and a methanofullerene, namely [6,6]-phenyl-C61-butyric acid methyl ester (PCBM) as an electron acceptor. A layer of polyethylenedioxythiophene-polystyrenesulfonate (PEDOT-PSS, Baytron P., H. C. Starck, aqueous suspension) will be applied onto a substrate polyester) coated with an indium tin oxide (ITO 100 nm), which serves as a transparent front electrode, in a thickness of about 100 nm by spin coating. Subsequently, and as a photo active layer, a composite of thieno[3,4-b]pyrazine copolymers and PCBM (1:2 mass ratio), referred to in the example, will be applied in the form of a solution also by spin coating (layer thickness of about 100 nm). Chlorobenzene is employed as a solvent. The photovoltaic cell will be completed by a thermally vapor deposited aluminum electrode and subsequently characterized by recording current-voltage characteristics by means of an AM1.5 solar simulator (100 mW/cm$^2$). The solar cell obtained in such a manner exhibits a short-circuit current of 8.90 mA/cm$^2$, an open-circuit voltage of 690 mV, a space factor of 0.37 as well as an efficiency of 2.27%.

Embodiment 6 (Example 6)

For photovoltaic cells a thieno[3,4-b]pyrazine copolymer according to embodiment 1 will be used with R$_1$=R$_2$=phenyl, Ar=2,5-dialkoxyphenylene with R$_3$=R$_4$=OC$_{12}$H$_{25}$ as an electron donator and a methanofullerene, namely [6,6]-phenyl-C61-butyric acid methyl ester (PCBM) as an electron acceptor. A layer of polyethylenedioxythiophene-polystyrenesulfonate (PEDOT-PSS, Baytron P., H. C. Starck, aqueous suspension) will be applied onto a substrate (polyester) coated with an indium tin oxide (ITO 100 nm) which serves as a transparent front electrode, in a thickness of about 100 nm by spin coating. Subsequently, and as a photo active layer, a composite out of thieno[3,4-b]pyrazine copolymers and PCBM (1:2 mass ratio), referred to in the example, will be applied in the form of a solution also by spin coating (layer thickness of about 100 nm). Chlorobenzene is employed as a solvent. The photovoltaic cell will be completed by a thermally vapor deposited aluminum electrode and subsequently evaluated by recording current-voltage characteristics by means of an AM1.5 solar simulator (100 mW/cm$^2$). The solar cell obtained in such a manner exhibits a short-circuit current of 4.52 mA/cm², an open-circuit voltage of 700 mV, a space factor of 0.43 as well as an efficiency of 1.36%.

Embodiment 7 (Example 7)

For photovoltaic cells a thieno[3,4-b]pyrazine copolymer will be used according to embodiment 1 with $R_1=R_2$=phenyl, Ar=2,5-dialkoxyphenylene with $R_3=R_4$=OC$_{12}$H$_{25}$ as an electron donator and a methanofullerene, namely [6,6]-phenyl-C61-butyric acid methyl ester (PCBM) as an electron acceptor. A layer of polyethylenedioxythiophene polystyrenesulfonate (PEDOT-PSS, Baytron P., H. C. Starck, aqueous suspension) will be applied onto a substrate (polyester) coated with an indium tin oxide (ITO 100 nm), serving as a transparent front electrode, in a thickness of about 100 nm by spin coating. Subsequently, and as a photo active layer, a composite of thieno[3,4-b]pyrazine copolymers and PCBM (1:3 mass ratio), mentioned in the example, will be applied as a solution also by spin coating (layer thickness of about 100 nm). Chlorobenzene is employed as a solvent. The photovoltaic cell will be completed by a thermally vapor deposited aluminum electrode and subsequently characterized by recording current-voltage characteristics by means of an AM1.5 solar simulator (100 mW/cm²). The solar cell obtained in such a manner exhibits a short-circuit current of 3.53 mA/cm², an open-circuit voltage of 725 mV, a space factor of 0.44 as well as an efficiency of 1.13%.

The invention claimed is:

1. Method for preparing thieno[3,4-b]pyrazine copolymers by reacting 5,7-disubstituted thieno[3,4-b]pyrazine of the formula I with substituted aromatics of the formula II and/or of the formula III in the presence of solvents, suited bases and polymerization catalysts, wherein represent

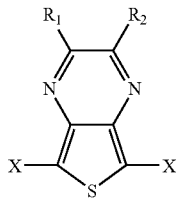

Formula I $R_1/R_2$=Phenyl; pyridine-2yl; pyridine-4-yl; thiophene-2-yl; thiophene-3-yl; 2,2-bipyridine-3,3-diyl; biphenyl-2,2-diyl; —O-alkyl; -phenylene-O-alkyl; or —H
X=-halogen; —Ar—CHO; or —Ar-halogen
Ar=thieno[3,4-b]pyrazine-5,7-diyl; benzothiadiazol-4,7-diyl; 1,4-phenylene; 1,3-phenylene; 9,10-anthrylene; 2,6-anthrylene; or 2,7-fluorenylene

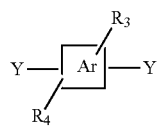

Formula II $R_3/R_4$=linearly or branched -alkyl; —O-alkyl; -phenylene-O-alkyl; -styryl; or —H
Y=—C≡CH; CR$_5$=CHR$_6$; —B(OH)$_2$; —B(Oalkyl)$_2$; or —CH$_2$Z
with R$_6$=—H; or —Ar-halogen
with R$_5$=—H; —CN; or —Ar
with Z=—P(O)(OAlkyl)$_2$; —P(phenylene)$_3$halogen; —P(alkyl)$_3$halogen; or —CN
Ar=Thieno[3,4-b]pyrazine-5,7-diyl; benzothiadiazol-4,7-diyl; 1,4-phenylene; 1,3-phenylene; 9,10-anthrylene; 2,6-anthrylene; or 2,7-fluorenylene

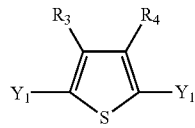

Formula III $R_3/R_4$=linearly or branched: -alkyl; —O-alkyl; -phenylene-O-alkyl; -styryl; or —H
$Y_1$=—C≡CH; —CR$_5$=CHR$_6$; or —CH$_2$Z with R$_6$=—H; or —Ar-halogen with R$_5$=—H; —CN; or —Ar
with Z=—P(O)(Oalkyl)$_2$; —P(phenylene)$_3$halogen; —P(alkyl)$_3$halogen; or —CN;
Ar=Thieno[3,4-b]pyrazine-5,7-diyl; benzothiadiazol-4,7-diyl; 1,4-phenylene; 1,3-phenylene; 9,10-anthrylene; 2,6-anthrylene; or 2,7-fluorenylene
with disclaiming the reaction of Formula I provided that X=halogen means—with Formula II—when B(OH)$_2$ or B(Oalkyl)$_2$ stands for Y and 2,7-fluorenylene stands for Ar—as well as Formula I—when Ar-halogen stands for X—with Formula II—when B(OH)$_2$ or B(Oalkyl)$_2$ stands for Y.

2. Method for preparing thieno[3,4-b]pyrazine copolymers as claimed in claim 1, characterized in that the method is carried out with inverse substitution, that is, X and Y as well as X and $Y_1$ are exchangeable.

3. Method for preparing thieno[3,4-b]pyrazine copolymers as claimed in claim 1, characterized in that the mol ratio of the monomer structure elements I and II, I and III, as well as I and (II+III) is 1:1 after reaction in the respective copolymers.

4. Method for preparing thieno[3,4-b]pyrazine copolymers as claimed in claim 1, characterized in that the method is carried out in the presence of a solvent selected from the group consisting of toluene, benzene, dimethyl formamide, dimethyl acetamide, tetra-hydrofurane and dioxane, of bases amine, potassium tert.-butylate, potassium carbonate, and of a polymerization catalyst selected from the group consisting of palladium(O)- and Pd(II)-compounds in the presence of or in the absence of Cu(I)-compounds.

5. Thieno[3,4-b]pyrazine copolymers produced according to the methods of claim 1.

6. Solar cells, photodiodes, or photo detectors comprising the thieno[3,4-b]pyrazine copolymers produced according to the methods of claim 1.

7. The method according to claim 1 further comprising
preparing a substrate;
placing a transparent front electrode onto the substrate;
applying a layer of a composite of thieno[3,4-b]pyrazine copolymers onto the transparent front electrode;
depositing an electrode onto the layer with the composite for producing organic light emitting diodes.

8. Organic transistors comprising the thieno[3,4-b]pyrazine copolymers produced according to the methods of claim 1.

9. The method according to claim 1, further comprising
furnishing a polyester substrate;
spin coating the polyester substrate with a transparent indium tin oxide front electrode;

applying a layer of polyethylenedioxythiophene-polystyrenesulfonate onto the front electrode applying a composite of thieno[3,4-b]pyrazine copolymers and [6,6]-phenyl-61-butyric acid methyl-ester as a photoactive layer to the polyester substrate;

thermally vapor depositing an aluminum electrode for completing the photovoltaic cell.

10. Organic material for solar cells, photodiodes, or photo detectors, comprising at least one thieno[3,4-b]pyrazine copolymers occurring according to claim 5.

11. Organic material for light emitting diodes comprising at least one thieno[3,4-b]pyrazine copolymers as defined in claim 5.

12. Organic material for phototransistors comprising at least one thieno[3,4-b]pyrazine copolymers as defined in claim 5.

* * * * *